US008711917B2

(12) United States Patent
Tsukamoto et al.

(10) Patent No.: US 8,711,917 B2
(45) Date of Patent: Apr. 29, 2014

(54) SAMPLING FILTER DEVICE (75) Inventors: Satoshi Tsukamoto, Osaka (JP);
Noriaki Saito, Tokyo (JP); Katsuaki Abe, Kanagawa (JP); Kentaro Miyano, Osaka (JP); Yoshifumi Hosokawa, Osaka (JP); Yasuyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 518 days.

(21) Appl. No.: 12/812,655

(22) PCT Filed: Jan. 16, 2009

(86) PCT No.: PCT/JP2009/000148
§ 371 (c)(1),
(2), (4) Date: Oct. 6, 2010

(87) PCT Pub. No.: WO2009/090883
PCT Pub. Date: Jul. 23, 2009

(65) Prior Publication Data
US 2011/0013736 A1 Jan. 20, 2011

(30) Foreign Application Priority Data
Jan. 16, 2008 (JP) .................................. 2008-007176

(51) Int. Cl.
*H03H 7/30* (2006.01)
*H03H 7/40* (2006.01)
*H03K 5/159* (2006.01)

(52) U.S. Cl.
USPC ............................................ 375/229; 333/18

(58) Field of Classification Search
None
See application file for complete search history.

(56) References Cited

U.S. PATENT DOCUMENTS

| | | | | |
|---|---|---|---|---|
| 3,918,050 A | * | 11/1975 | Dorsman | 341/158 |
| 4,238,746 A | * | 12/1980 | McCool et al. | 333/166 |
| 4,322,697 A | * | 3/1982 | Carbrey | 333/173 |
| 4,574,271 A | * | 3/1986 | Yada | 341/118 |
| 4,771,175 A | * | 9/1988 | Sirieix et al. | 250/332 |
| 5,038,096 A | * | 8/1991 | Obie et al. | 324/76.23 |
| 5,107,227 A | * | 4/1992 | Brooks | 331/8 |
| 5,572,012 A | * | 11/1996 | Saito et al. | 250/201.6 |

(Continued)

FOREIGN PATENT DOCUMENTS

| | | |
|---|---|---|
| JP | 2003-510933 A | 3/2003 |
| JP | 2006-211153 A | 8/2006 |

(Continued)

OTHER PUBLICATIONS

International Search Report for PCT/JP2009/000148 dated Apr. 21, 2009.

*Primary Examiner* — Shuwang Liu
*Assistant Examiner* — Gina McKie
(74) *Attorney, Agent, or Firm* — Pearne & Gordon LLP (57) ABSTRACT

A sampling filter device wherein the filter characteristic is variable without using a control signal of a complicated waveform is provided. A sampling filter device 105 has integration capacitors 130 and 131, an integration time adjustment section 180, and a plurality of switches 100, 101, 110, and 111. Input current is integrated in different time duration with one clock and is stored in the integration capacitors 130 and 131 and charges stored in the integration capacitor from several clocks before to one clock before are added and the result is output. When charge is stored in the integration capacitors 130 and 131 with each clock, the integration time duration is changed, whereby it is made possible to weight and add output charge and the filter characteristic changes.

12 Claims, 7 Drawing Sheets

105
SAMPLING FILTER DEVICE (M=4)

(56) References Cited

U.S. PATENT DOCUMENTS

| | | | |
|---|---|---|---|
| 7,053,673 B1 | 5/2006 | Yuan | |
| 2003/0141917 A1* | 7/2003 | McBrien | 327/304 |
| 2004/0037442 A1* | 2/2004 | Nielsen et al. | 381/315 |
| 2005/0105657 A1* | 5/2005 | Kroeger et al. | 375/347 |
| 2006/0261875 A1* | 11/2006 | Breems et al. | 327/359 |
| 2008/0299937 A1* | 12/2008 | Miyano et al. | 455/337 |
| 2009/0021296 A1* | 1/2009 | Miyano et al. | 327/553 |

FOREIGN PATENT DOCUMENTS

| | | |
|---|---|---|
| JP | 2007-189666 A | 7/2007 |
| JP | 2007-243431 A | 9/2007 |
| WO | 2007/148693 A1 | 12/2007 |

\* cited by examiner

FIG.1

105
SAMPLING FILTER DEVICE (M=4)

SAMPLING FILTER DEVICE

TECHNICAL FIELD

This invention relates to a sampling filter device in which the frequency characteristic is variable.

BACKGROUND ART

In a receiving device in a wireless communication system, a sampling filter device is used for performing frequency conversion by discrete time charge sampling and filtering.

Figure 12:
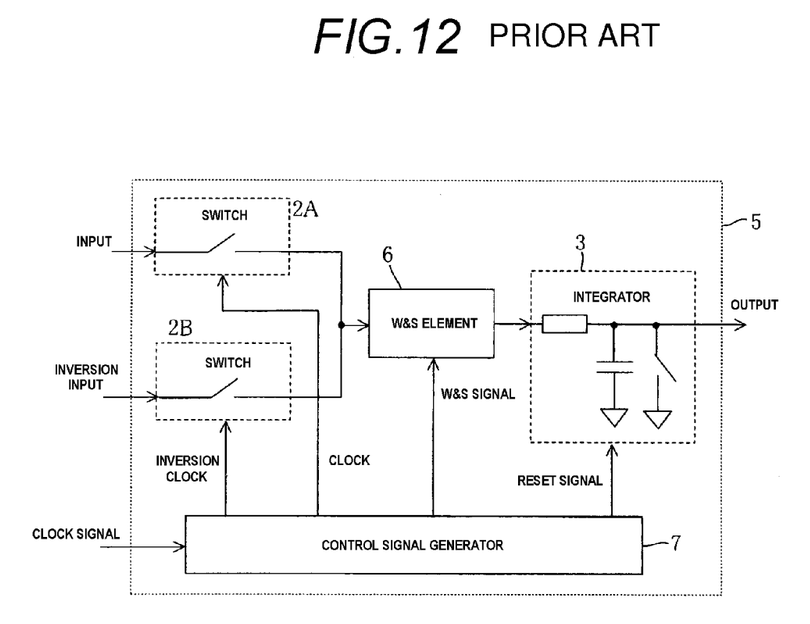
FIG. 12 shows the configuration of a conventional sampling filter device.

For example, Patent Document 1 describes a conventional sampling filter device. FIG. 12 shows the conventional sampling filter device described in Patent Document 1. The sampling filter device described in Patent Document 1 will be briefly described.

As shown in FIG. 12, a conventional sampling filter device 5 has a switch 2A, a switch 2B, an integrator 3, and a weight and sampling (W&S) element 6, and a control signal generator 7. Three processes of reset, sampling, and hold are respectively performed by a clock and an inversion clock, a W&S signal, and a reset signal generated from the control signal generator 7.

The filter characteristic of the sampling filter device is determined by a weight function. The weight function depends on a combination of the W&S element 6 and the W&S signal. The W&S signal corresponds to the three weight functions (constant, inclined, and Gaussian).

A current signal passing through the W&S element 6 is zero outside a sampling window and is weighted in accordance with the weight functions (constant, inclined, and Gaussian) inside the sampling window. Thus, output of the W&S element 6 is weighted by the W&S signal, whereby the filter characteristic can be changed.

JP-A-2003-510933 (page. 31, FIG. 2A)

DISCLOSURE OF THE INVENTION

Problems to be Solved by the Invention

However, in the conventional sampling filter device 5 described in Patent Document 1, it is necessary to provide complicated waveforms of an inclined waveform, a Gaussian waveform, etc., as the W&S signal to change the filter characteristic. Thus, there is a problem in that high vertical axis resolution is required for a control signal and the circuit scale becomes large.

In view of the above-described problem in the related art, it is an object of the invention to provide a sampling filter device for realizing weighting without using a complicated waveform for a control signal and making the frequency characteristic variable.

Means for Solving the Problems

A sampling filter device according to the present invention comprises: a first voltage current converter which converts an input voltage signal into a current; a first integration unit which samples the current output from the first voltage current converter and integrates the sampled current; a local oscillator which outputs a reference clock; and an integration time duration control unit which generates an integration time duration control signal for controlling integration time duration in the first integration unit based on the reference clock, and makes the integration time duration variable, thereby performing weighting of a filter characteristic in response to the integration time duration.

According to the configuration described above, current is sampled in accordance with the integration time duration control signal, whereby the sampling time is changed, whereby the charge amount stored in the integrator can be changed, so that the sampling filter device that can realize weighting using a signal of a simple waveform of a rectangular wave, a sine wave, etc., without using a complicated waveform for the control signal and makes the frequency characteristic variable.

In the sampling filter according to the present invention, the integration time duration control unit may generate the integration time duration control signal so that each pulse of the integration time duration control signal is positioned in the center of a half period of the reference clock.

According to the configuration described above, the transfer function at the position even-numbered times the basic frequency can be set to zero and the effect of turn by decimation can be decreased.

The sampling filter device according to the present invention may be configured in that the integration time duration control unit generates the integration time duration control signal to control an on interval of the first sampling switch with finer accuracy than that of the reference clock.

According to the configuration described above, the ratio between the on interval and the off interval of the sampling switch is adjusted with finer accuracy than that of the reference clock and weighting can be realized.

The sampling filter device according to the present invention may be configured by comprising a second sampling switch which samples the current output from the first voltage current converter, a second integrator which integrates the sampled current in the second sampling switch and a differential combining section which differentially combines outputs of the first and second integrators, wherein the integration time duration control unit generates the integration time duration control signal so that the first sampling switch is turned on in the high-level interval of the reference clock and the second sampling switch is turned on in the low-level interval of the reference clock.

According to the configuration described above, the off interval of the reference clock can also be used for integration, so that the integration time duration can be doubled apparently.

The sampling filter device according to the present invention may be configured by comprising a second voltage current converter having a gain different from that of the first voltage current converter, and a changeover switch for switching the first and second voltage current converters.

According to the configuration described above, the voltage current converters different in gain are switched, whereby the integration charge amount per unit time can be changed and weighting in the amplitude direction is also made possible, so that flexibility of design increases.

The sampling filter device according to the present invention may be configured in that the integration time duration control unit generates a switch control signal for switching connection of the first or second voltage current converter and the first sampling switch.

According to the configuration described above, switching of the voltage current converter can be controlled by the switch control signal.

The sampling filter device according to the present invention may be configured in that the integration time duration control unit has: a multiplier which multiplies the reference clock supplied from the local oscillator; and a control signal generator which generates the integration time duration control signal based on a multiplication signal supplied from the multiplier.

According to the configuration described above, the integration time duration control signal with finer accuracy than that of the reference clock can be generated.

The sampling filter device according to the present invention may be configured in that the integration time duration control unit has a control signal generator to which the reference clock, an inverse phase signal to the reference clock, an addition signal provided by adding a signal whose phase is 90° different from that of the reference clock to the reference clock, and a signal provided by adding the addition signal to the inverse phase signal to the reference clock are input, and which is controlled by a signal of a double frequency of the reference clock.

According to the configuration described above, the integration time duration control signal with finer accuracy than that of the reference clock can be generated.

The sampling filter device according to the present invention may be configured in that the integration time duration control unit has: a first dividing-type phase shifter which generates a first signal provided by dividing a clock having a double frequency of the reference clock and a second signal whose phase is 90° different from that of the first signal; a second dividing-type phase shifter which generates a third signal provided by dividing an inverse phase signal to the clock having the double frequency of the reference clock and a fourth signal whose phase is 90° different from that of the third signal; a first adder which outputs a fifth signal provided by adding the first signal to the second signal; a second adder which outputs a sixth signal provided by adding the third signal to the second signal; and a control signal generator for generating the integration time duration control signal based on the first signal, the third signal, the fifth signal, the sixth signal, and the clock having the double frequency of the reference clock.

According to the configuration described above, the integration time duration control signal with finer accuracy than that of the reference clock can be generated.

The sampling filter device according to the present invention may be configured in that the reference clock is a sinusoidal signal, the integration time duration control unit has an amplitude modulator which performs amplitude modulation of the sinusoidal signal, and the first sampling switch samples the current output from the first voltage current converter while output of the amplitude modulator exceeds a predetermined threshold value.

According to the configuration described above, the integration time duration control signal with finer accuracy than that of the reference clock can be generated.

The sampling filter device according to the present invention may be configured in that the reference clock is a sinusoidal signal, and a control signal generator is comprised which generates a switch control signal for switching connection of the first or second voltage current converter and the first and second sampling switches based on the sinusoidal signal.

According to the configuration described above, the switch control signal can be generated from the sinusoidal signal.

A wireless communication device according to the present invention comprises: the sampling filter device as described above; a buffer section for converting and outputting charge amount charged in the plurality of integrators in the sampling filter device into a voltage value; an A/D section which converts an analog signal output from the buffer section into a digital signal; and a base band section which performs demodulation processing or decoding processing for the digital signal provided by the A/D section.

According to the configuration described above, the wireless communication device installing the sampling filter device that can realize weighting using a signal of a simple waveform of a rectangular wave, a sine wave, etc., without using a complicated waveform for the control signal and makes the frequency characteristic variable can be realized.

Advantageous Effects of the Invention

According to the sampling filter device of the invention, when the current is sampled in accordance with the integration time duration control signal, the sampling time is changed, whereby the charge amount stored in the integrator can be changed, so that weighting can be realized using a signal of a simple waveform of a rectangular wave, a sine wave, etc., without using a complicated waveform for the control signal and the frequency characteristic can be made variable.

DESCRIPTION OF REFERENCE NUMERALS AND SIGNS 100, 101 Changeover switch for voltage current converter
105 Sampling filter device
110, 111 Sampling switch
120, 121 Voltage current converter
130, 131 Integration capacitor
140 Differential combining section
150, 250 Local oscillator
160, 260, 360 Control signal generator
170 Multiplier
180 Integration time duration control unit
270, 271 Dividing-type phase shifter
280, 281 Adder
200 Wireless communication device
201 Sampling filter section 202 Buffer section
203 A/D section
204 Base band section
570 Amplitude modulator

BEST MODE FOR CARRYING OUT THE INVENTION

Embodiments of the invention will be described below with reference to the accompanying drawings:

Embodiment 1

Figure 1:
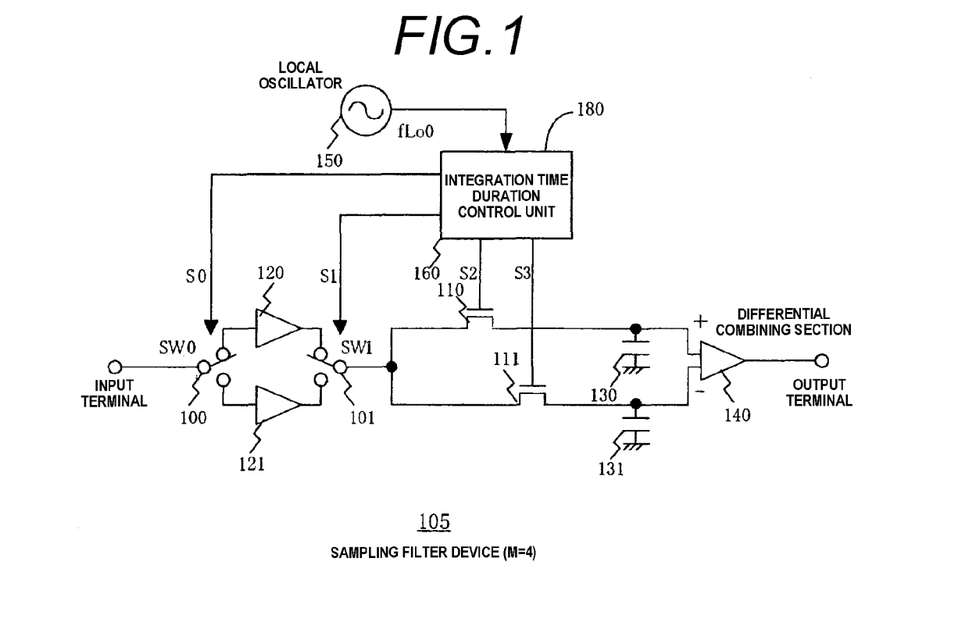
FIG. 1 shows the configuration of a sampling filter device in Embodiment 1 of the invention.

FIG. 1 shows the configuration of a sampling filter device in Embodiment 1 of the invention. As shown in FIG. 1, a sampling filter device 105 includes voltage current converters 120 and 121, changeover switch for voltage current converters SW0 (100) and SW1 (101), sampling switches 110 and 111, integration capacitors 130 and 131, a local oscillator 150, and an integration time duration control unit 180. The embodiment shows an example of configuring a filter such that filter coefficient $(a_1, a_2, a_3, a_4, a_5)=(1, 4, 6, 4, 1)$ if a transfer function H (z) is represented as $H(z)=a_1+a_2z^{-1}+a_3z^{-2}+a_4z^{-3}+a_5z^{-4}$. The sampling switch 110 and the integration capacitor 130 may be called first integration unit in combination and the sampling switch 111 and the integration capacitor 131 may be called second integration unit in combination.

The local oscillator 150 outputs a signal fLo0 of a frequency of a reference clock. In the embodiment, the integration time duration control unit 180 generates pulse signals, namely, integration time duration control signals S2 and S3 and switch control signals S0 and S1 based on the signal fLo0 supplied from the local oscillator 150.

The voltage current converters 120 and 121 convert a voltage input signal into a current and outputs the current; for example, they are transformer conductance amplifiers (TA). The voltage current converters 120 and 121 differ in voltage-current characteristic (gain). In the embodiment, as mutual conductance gm1 and gm2 of the voltage current converters 120 and 121, gm2=gm1;2. The voltage current converters 120 and 121 can be switched by the changeover switch for voltage current converters SW0 (100) and SW1 (101).

The changeover switch for voltage current converter SW0 (100) switches connection of an input terminal and the voltage current converter 120 or 121 in response to a switch control signal S0 output from a control signal generation section 160. The changeover switch for voltage current converter SW1 (101) switches connection of the voltage current converter 120 or 121 and the sampling switches 110 and 111 in response to a switch control signal S1 output from the control signal generation section 160.

The sampling switches 110 and 111 sample currents input from the voltage current converters 120 and 121 based on the integration time duration control signals S2 and S3 input from the control signal generator 160 and output the currents to the integration capacitors 130 and 131 respectively. When the sampling switch 110 is ON, the integration capacitor 130 is charged; when the sampling switch 111 is ON, the integration capacitor 131 is charged. According to the configuration, it is made possible to adjust the integration time duration for each clock time and the sample value can be weighted. The charge integrated over N clocks (N is an integer of 2 or more; in the embodiment N=5) in the integration capacitor 130, 131 is discharged to an output terminal through a differential combining section 140 when the sampling stage terminates. According to the configuration, a filter function of N taps is implemented.

The differential combining section 140 differentially combines outputs from two pairs of the sampling switch 110 (111) and the integration capacitor 130 (131) provided in parallel, namely, outputs from the integration capacitors 130 and 131.

According to the configuration, the input signal (current) output from the voltage current converter 120 (121) is sampled in the sampling switch 110 (111) based on the integration time duration control signal S2 (S3) output from the integration time duration control unit 180 and the current output from the sampling switch 110 (111) is integrated in the integration capacitor 130 (131). That is, the sampling filter device 105 of the embodiment includes the local oscillator 150, the integration time duration control unit 180, the sampling switch 110 (111), and the integration capacitor 130 (131) in the configuration shown in FIG. 1, thereby storing the sample value weighted in response to the integration time duration varying for each clock of the reference clock in the integration capacitor 130 (131) and then discharging, so that weighting is realized and any desired filter characteristic can be realized without using a complicated waveform for the control signal.

The sampling filter device 105 of the embodiment includes two pairs of the sampling switch 110 (111) and the integration capacitor 130 (131) provided in parallel and further includes the differential combining section 140 for differentially combining outputs therefrom, whereby in an OFF interval of one sampling switch (for example, 110), sampling becomes possible in another switch (for example, 111), so that sampling corresponding to an inversion clock can also be performed effectively. That is, according to the configuration, the off interval of the reference clock can also be used for integration and the integration time duration can be doubled apparently.

The sampling filter device 105 of the embodiment further includes the two voltage current converters 120 and 121 different in voltage-current characteristic and the switches 100 and 101 for switching them, whereby the integration charge amount per unit time can be changed and weighting in the amplitude direction is also made possible. According to the configuration, weighting not only in the time axis direction, but also in the amplitude direction is possible, resolution can be doubled or more, and flexibility of design increases. If the number of pairs of the sampling switch 110 (111) and the integration capacitor 130 (131) is one, connection of the voltage current converter 120, 121 and the sampling switch 110 (111) is switched, whereby weighting in the amplitude direction becomes possible and flexibility of design increases.

Figure 2:
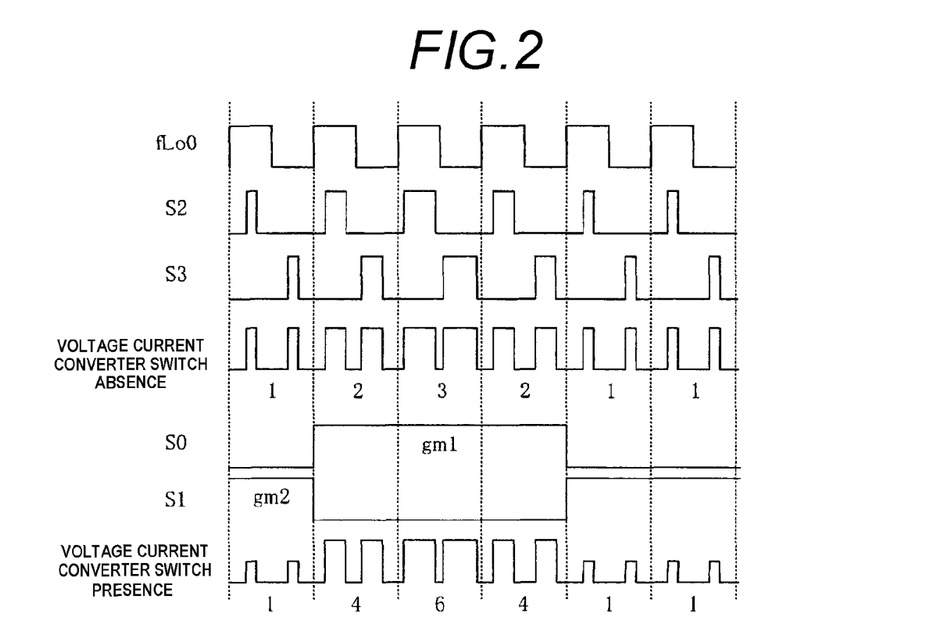
FIG. 2 shows control signals in Embodiment 1 of the invention.

FIG. 2 shows an example of a timing chart of signals to configure a filter whose filter coefficient is (1, 4, 6, 4, 1).

In FIG. 2, the signal fLo0 is an output signal of the local oscillator 150. The signals S2 and S3 are the integration time duration control signals output from the control signal generator 160 and turn on/off the sampling switches 110 and 111. The signal S2 is turned on at least in a part of the high-level interval of the signal fLo0, and the signal S3 is turned on at least in a part of the low-level interval of the signal fLo0.

A voltage current converter switch absence signal represents integration amount in receiving control of the signal S2, S3 when only one voltage current converter 120 operates, namely, the changeover switches SW0 (100) and SW1 (101) are connected to the voltage current converter 120. The area of the rectangular part of the signal (1, 2, 3, 2, 1) corresponds to the filter coefficient of the sampling filter device.

The signals S0 and S1 are changeover control signals of the changeover switches SW0 (100) and SW1 (101). The changeover switch SW0 (100) and the changeover switch SW1 (101) are connected to the voltage current converter 121 of the mutual conductance gm2 in the interval wherein the signal S0 is low and the signal S1 is high. The signals S0 and S1 are changeover control signals of the changeover switches SW0 (100) and SW1 (101). The changeover switch SW0 (100) and the changeover switch SW1 (101) are connected to the voltage current converter 120 of the mutual conductance gm1 in the interval wherein the signal S0 is high and the signal S1 is low.

A voltage current converter switch presence signal represents integration amount in receiving control of the signal S2, S3 when the voltage current converters 120 and 121 are switched by the signals S0 and S1. The amplitude of the signal can be varied in response to the mutual conductance gm1, gm2, and the area of the rectangular part of the signal (1, 4, 6, 4, 1) corresponds to the filter coefficient of the sampling filter device.

Thus, if the voltage current converters 120 and 121 are not switched, the filter coefficient becomes (1, 2, 3, 2, 1). On the other hand, if they are switched, the filter coefficient can be made (1, 4, 6, 4, 1) by controlling the changeover switches SW0 (100) and SW1 (101) as shown in the changeover control signals S0 and S1 in FIG. 2. FIG. 2 shows the case where gm2=gm/1;2 as the mutual conductance gm1 and gm2 of the two voltage current converters 120 and 121.

Figure 3:
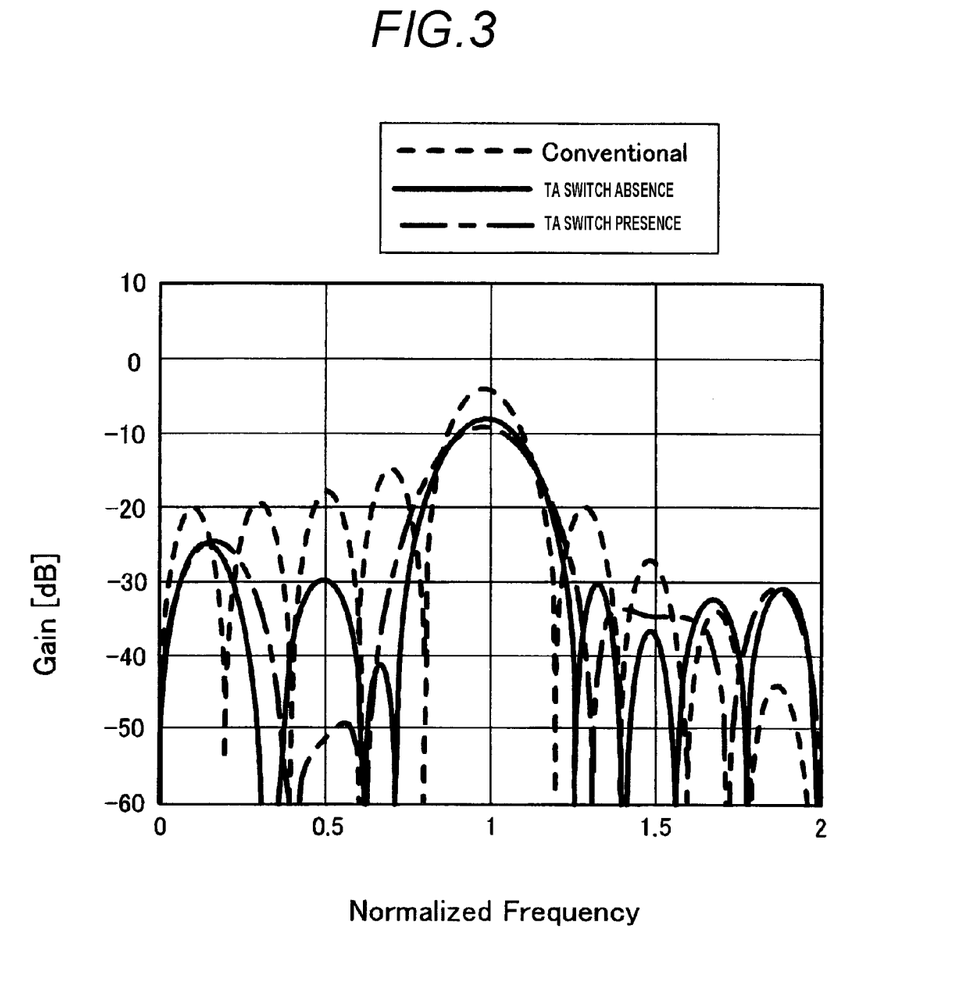
FIG. 3 shows the frequency characteristic of the sampling filter device in Embodiment 1 of the invention.

FIG. 3 shows the frequency characteristic of the sampling filter device of the embodiment (voltage current converter (TA) switch absence: solid line, TA switch presence: alternate long and short dash line). Thus, according to the sampling filter device of the embodiment, a wider band is realized as compared with the frequency characteristic (dashed line) of the conventional sampling filter device of moving average type (weighting of rectangular window) according to the weighting effect described above. A larger side lobe attenuation amount can be taken than that of the conventional device.

As described above, according to the embodiment, weighting not only in the time axis direction, but also in the amplitude direction is possible, resolution can be doubled or more, and flexibility of design increases. That is, weighting can be realized and any desired filter characteristic can be realized without using a complicated waveform for the control signal.

Second Embodiment

Figure 4:
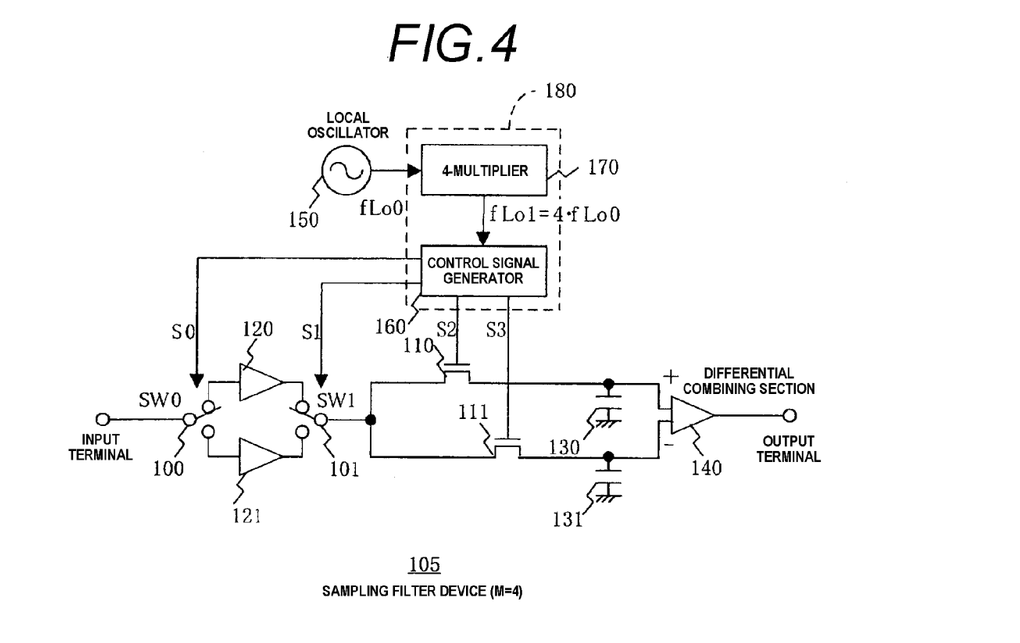
FIG. 4 shows the configuration of a sampling filter device in Embodiment 2 of the invention.

FIG. 4 is a configurative diagram of a sampling filter device of Embodiment 2 of the invention. Components identical with those in FIG. 1 are denoted by the same reference numerals in FIG. 4 and will not be described again. An example of configuring a filter whose filter coefficient becomes (1, 4, 6, 4, 1) will be described as in Embodiment 1.

In Embodiment 2, an integration time duration control unit 180 includes an M-multiplier 170 (M is an integer of 2 or more; in the embodiment M=4) and a control signal generator 160. The 4-multiplier 170 outputs a signal (multiplication signal) 4/Lo0 of a frequency four times a reference frequency fLo0 of input. The control signal generator 160 generates pulse signals, namely, integration time duration control signals S2 and S3 and changeover control signals S0 and S1 based on the multiplication signal 4/Lo0 supplied from the 4-multiplier 170. The integration time duration control signals S2 and S3 are output from the integration time duration control unit 180, whereby the integration time duration can be adjusted with accuracy four times that of the reference clock.

Figure 5:
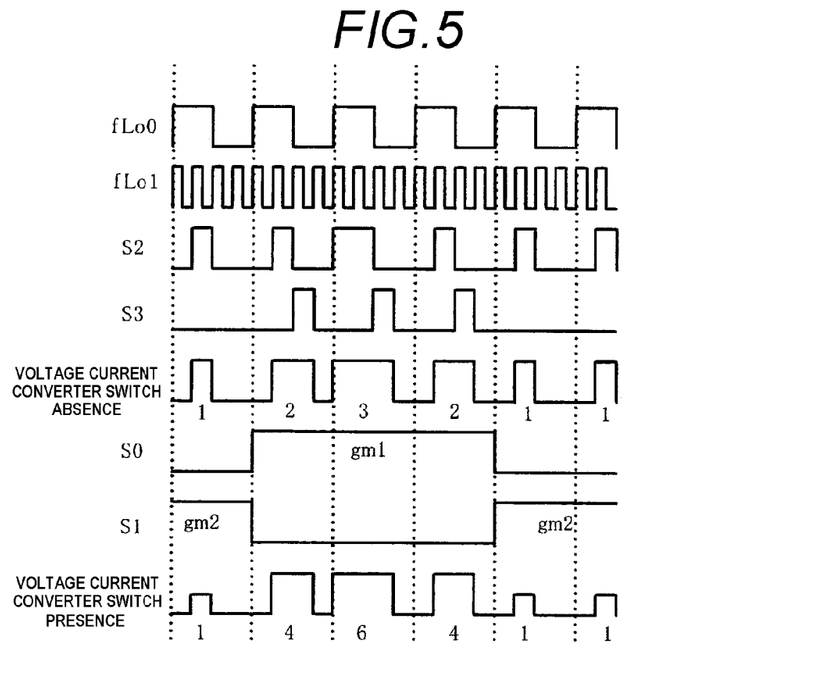
FIG. 5 shows control signals in Embodiment 2 of the invention.

FIG. 5 shows an example of a timing chart of signals to configure a filter whose filter coefficient is (1, 4, 6, 4, 1).

In FIG. 5, the signal fLo0 is an output signal of a local oscillator 150. A signal fLo1 is an output signal of the 4-multiplier 170 and has a frequency four times the signal fLo0. Signals S2 and S3 are integration time duration control signals output from the control signal generator 160 and turn on/off sampling switches 110 and 111.

Signals S2 and S3, a voltage current converter switch absence signal, signals S0 and S1, and a voltage current converter switch presence signal are similar to those shown in FIG. 2.

Embodiment 3

Figure 6:
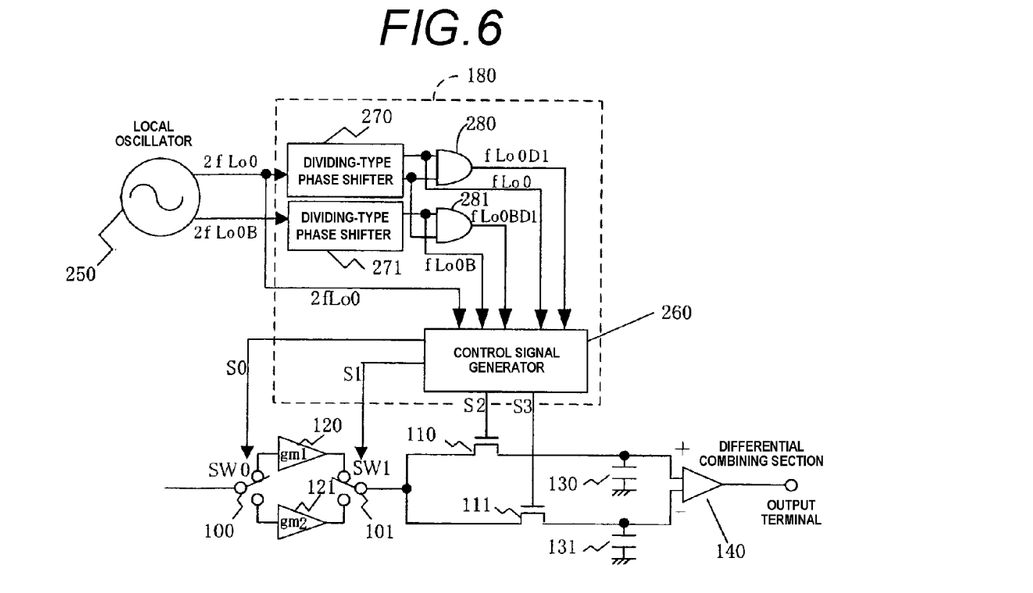
FIG. 6 shows the configuration of a sampling filter device in Embodiment 3 of the invention.

FIG. 6 is a configurative diagram of a sampling filter device of Embodiment 3 of the invention. Components identical with those in FIG. 1 are denoted by the same reference numerals in FIG. 6 and will not be described again. An example of configuring a filter whose filter coefficient becomes (1, 4, 6, 4, 1) will be described as in Embodiment 1.

In Embodiment 3, unlike Embodiment 2, an integration time duration control unit 180 includes dividing-type phase shifters 270 and 271, adders 280 and 281, and a control signal generator 260. A local oscillator 250 generates a reference signal 2/Lo0 of a double frequency of a reference clock and a signal 2/Lo0B of inverse phase to the reference signal 2/Lo0.

The dividing-type phase shifter 270 receives the signal 2/Lo0 output from the local oscillator 250, lowers the frequency of oscillation output signal to a half, and generates two signals 90° out of phase with each other. The dividing-type phase shifter 271 also performs similar processing for the signal 2/Lo0B of inverse phase. The signals (the two signals from the dividing-type phase shifter 270 and one signal from the dividing-type phase shifter 271) are connected as shown in FIG. 6 and are added by the adders 280 and 281, thereby providing four signals fLo0, fLo0B, fLo0D1, and fLo0BD1 shown in FIG. 7.

The control signal generator 260 drives the input signals fLo0, fLo0B, fLo0D1, and fLo0BD1 with a clock by the reference signal 2/Lo0, thereby generating integration time duration control signals S2 and S3 for controlling the sampling switches 110 and 111.

Figure 7:
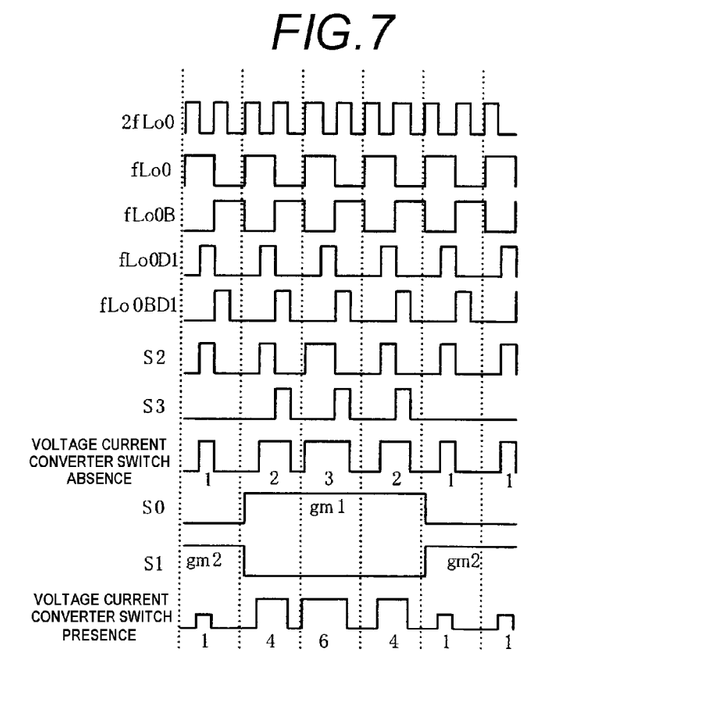
FIG. 7 shows control signals in Embodiment 3 of the invention.

FIG. 7 is a timing chart of the signals in the embodiment. The signal 2/Lo0 is an output signal of the local oscillator 250. The signal fLo0 is an output signal of the dividing-type phase shifter 270 and has a frequency of a half of the signal 2/Lo0. The signal fLo0B is an output signal of the dividing-type phase shifter 271 and is an inverse phase signal to the signal fLo0.

The signal fLo0D1 is generated by adding two signals 90° out of phase with each other output from the dividing-type phase shifter 270 by the adder 280. The signal fLo0BD1 is generated by adding two signals 90° out of phase with each other output from the dividing-type phase shifters 270 and 271 by the adder 281.

Signals S2 and S3, a voltage current converter switch absence signal, signals S0 and S1, and a voltage current converter switch presence signal are similar to those shown in FIG. 2.

Embodiment 4

Figure 8:
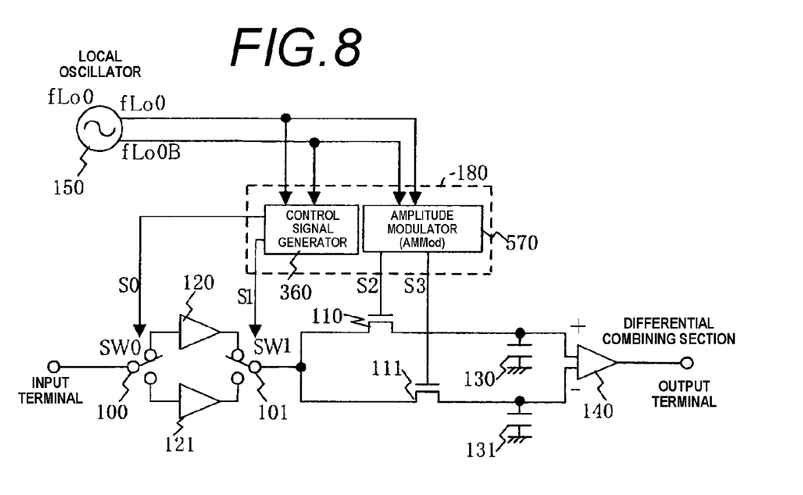
FIG. 8 shows the configuration of a sampling filter device in Embodiment 4 of the invention.

FIG. 8 is a configurative diagram of a sampling filter device of Embodiment 4 of the invention. Components identical with those in FIG. 1 are denoted by the same reference numerals in FIG. 8 and will not be described again. An example of configuring a filter whose filter coefficient becomes (1, 4, 6, 4, 1) will be described as in Embodiments 1, 2, and 3.

In Embodiment 4, an integration time duration control unit 180 includes a control signal generator 360 and an amplitude modulator 570. A local oscillator 150 outputs a reference signal fLo0 of a frequency of a reference clock and a reference signal fLo0B of inverse phase. In the embodiment, the signal fLo0 and the signal fLo0B output by the local oscillator 150 are sinusoidal signals. That is, the integration time is adjusted by amplitude modulation (AM modulation) of the reference signal (sinusoidal signal). The sampling filter device of the embodiment performs AM modulation of the sinusoidal signals fLo0 and fLo0B and adjusts the ON intervals of sampling switches 110 and 111. In the embodiment, each of the sampling switches 110 and 111 is turned ON while a signal for driving the sampling switch 110, 111 exceeds one threshold value.

The amplitude modulator 570 performs AM modulation of the sinusoidal signals fLo0 and fLo0B, changes the amplitudes, and outputs AM modulation signals S2 and S3 to the sampling switches 110 and 111 respectively as integration time duration control signals. The sampling switches 110 and 111 are turned on/off by the AM modulation signals S2 and S3, whereby the ON intervals of the sampling switches 110 and 111 are controlled and charges charged in integration capacitors 130 and 131 are controlled.

The control signal generator 360 generates switch control signals S0 and S1 based on a sinusoidal signal.

Figure 9:
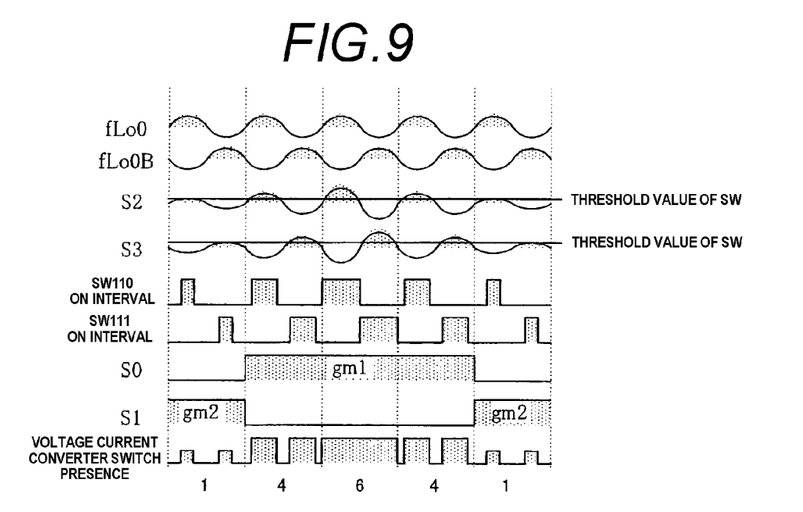
FIG. 9 shows control signals in Embodiment 4 of the invention.

FIG. 9 is a timing chart of the signals in the embodiment. As shown in FIG. 9, the reference signal is controlled by AM modulation, whereby the ON intervals of the switches can be adjusted so as to become S2 and S3 in FIG. 9. According to the configuration, weighting is performed.

In FIG. 9, the signal fLo0 is a sinusoidal signal output from the local oscillator 150 and the signal fLo0B is a sinusoidal signal of inverse phase to the signal fLo0. Signals S2 and S3 are integration time duration control signals output from the amplitude modulator 570 and turn on/off the sampling switches 110 and 111.

When the signal S2 is larger than a threshold value of the sampling switch 110, an SW110 ON interval signal goes high and corresponds to the on interval of the sampling switch 110. When the signal S3 is larger than a threshold value of the sampling switch 111, an SW111 ON interval signal goes high and corresponds to the on interval of the sampling switch 111.

Signals S0 and S1 and a voltage current converter switch presence signal are similar to those shown in FIG. 2.

In the embodiment, the integration time duration control unit 180 includes the control signal generator 360 by way of example, but the control signal generator 360 is not included in the integration time duration control unit 180 and may be a separate component.

Figure 10:
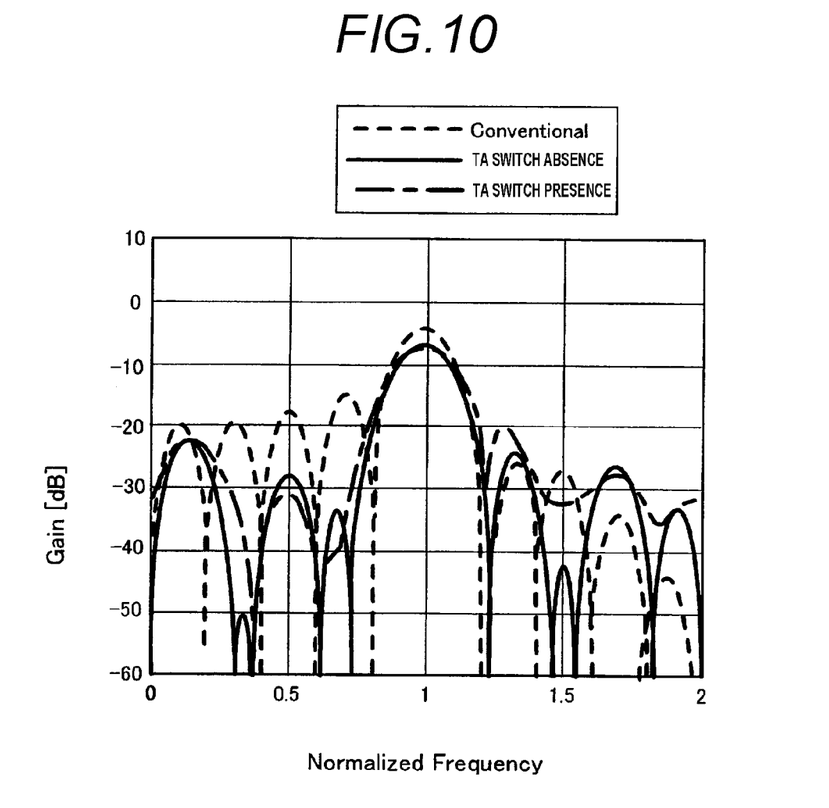
FIG. 10 shows the frequency characteristic of the sampling filter device in Embodiment 4 of the invention.

FIG. 10 shows the frequency characteristic of the sampling filter device of the embodiment (voltage current converter (TA) switch absence: solid line, TA switch presence: alternate long and short dash line). As with FIG. 3, a wider band is realized as compared with the frequency characteristic (dashed line) of the conventional sampling filter device. A larger side lobe attenuation amount can be taken than that of the conventional device.

Embodiment 5

Figure 11:
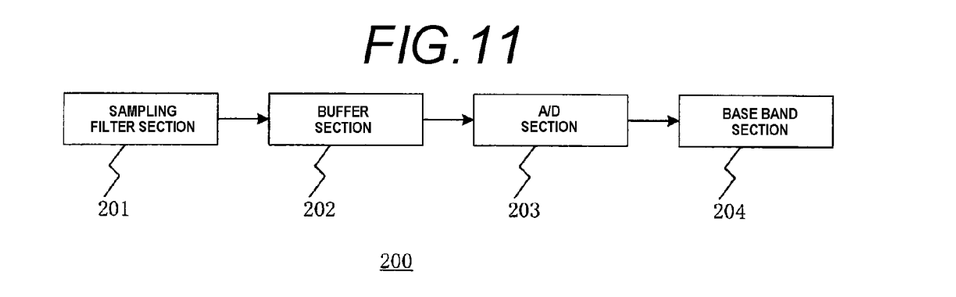
FIG. 11 is a block diagram to show the configuration of a wireless communication device in Embodiment 5 of the invention.

FIG. 11 is a block diagram to show the configuration of a wireless communication device in Embodiment 5 of the invention. In FIG. 11, a wireless communication device 200 has a sampling filter section 201, a buffer section 202, an A/D section 203, and a base band section 204.

The sampling filter section 201 has the same configuration as the sampling filter device 105 (FIG. 1) described in Embodiment 1, operates in a similar manner, and performs discretization and filtering for a radio frequency signal input from an antenna.

The buffer section 202 converts the charge in an integration capacitor in the sampling filter section 201 into a voltage value and outputs the voltage. For example, the buffer section 202 can be implemented as an operational amplifier, etc., for example. If the sampling filter section 201 is configured as in FIG. 1, the output voltage value can be made large by a differential combining section 140.

The A/D section 203 converts a discretized analog signal input from the buffer section 202 into a digital signal. The base band section 204 performs digital signal processing for the digital signal input from the A/D section 203. That is, the base band section 204 performs demodulation processing, decoding processing, etc., for the signal digitized by the A/D section 203.

According to the configuration, the sampling filter device of Embodiment 1 can be applied to the wireless communication device.

While the invention has been described in detail with reference to the specific embodiments, it will be obvious to those skilled in the art that various changes and modifications can be made without departing from the spirit and the scope of the invention.

This application is based on Japanese Patent Application (No. 2008-007176) filed on Jan. 16, 2008, which is incorporated herein by reference.

INDUSTRIAL APPLICABILITY

The invention has the effect that the integration time duration is adjusted instead of changing the amplitude of a control signal, whereby weighting is performed, addition is performed, and convolution is performed, whereby the sampling filter device requiring no complicated control unit can be provided. The invention is useful as a filter, etc., in an analog circuit in a wireless communication device.

The invention claimed is:
1. A sampling filter device comprising:
 a first voltage current converter which converts an input voltage signal into a current;
 a first integration unit which samples the current output from the first voltage current converter and integrates the sampled current;
 a local oscillator which outputs a reference clock;
 an integration time duration control unit which generates an integration time duration control signal for controlling integration time duration in the first integration unit based on the reference clock, and makes the integration time duration variable, thereby performing weighting of a filter characteristic of the sampling filter device in response to the variable integration time duration; and
 a second voltage current converter arranged in parallel with the first voltage current converter and having a gain different from that of the first voltage current converter, wherein
 the first integration unit samples the current output from the first voltage current converter or the second voltage current converter, and integrates the sampled current, and integration charge amount per unit time in the first integration unit is varied by switch control of the first voltage current converter and the second voltage current converter.

2. The sampling filter device as claimed in claim 1, wherein the integration time duration control unit generates the integration time duration control signal so that each pulse of the integration time duration control signal is positioned in the center of a half period of the reference clock.

3. The sampling filter device as claimed in claim 1, comprising:
a second integrator which samples the current output from the first voltage current converter or the second voltage current converter, and integrates the sampled current;
a differential combining section which differentially combines outputs of the first and second integrators, a first sampling switch for switching a connection between the first or second voltage current converters and the first integrator; and
a second sampling switch for switching a connection between the first or second voltage current converters and the second integrator, wherein
the integration time duration control unit generates the integration time duration control signal so that the first sampling switch is turned on in a part of the high-level interval of the reference clock and the second sampling switch is turned on in a part of the low-level interval of the reference clock.

4. The sampling filter device as claimed in claim 3, further comprising a changeover switch for switching the first and second voltage current converters, wherein
the integration time duration control unit generates, to the first and second sampling switches, a switch control signal for switching connection of the first or second voltage current converter and the first and second integration units in addition to generating the integration time duration control signal.

5. The sampling filter device as claimed in claim 4, wherein the reference clock is a sinusoidal signal, and
the integration time duration control unit comprises a control signal generator which generates a switch control signal for switching connection of the first or second voltage current converter and the first and second sampling switches based on the sinusoidal signal.

6. The sampling filter device as claimed in claim 1, wherein the integration time duration control unit has:
a multiplier which multiplies the reference clock supplied from the local oscillator; and
a control signal generator which generates the integration time duration control signal based on a multiplication signal supplied from the multiplier.

7. The sampling filter device as claimed in claim 1, wherein the reference clock is a sinusoidal signal,
the sampling filter comprises a first sampling switch for switching a connection between the first or second voltage current converters and the first integrator,
the integration time duration control unit has an amplitude modulator which performs amplitude modulation of the sinusoidal signal, and
the first sampling switch samples the current output from the first voltage current converter while output of the amplitude modulator exceeds a predetermined threshold value.

8. A wireless communication device comprising:
a sampling filter device as claimed in claim 1;
a buffer section for converting and outputting charge amount charged in the plurality of integrators in the sampling filter device into a voltage value;
an A/D section which converts an analog signal output from the buffer section into a digital signal; and
a base band section which performs demodulation processing or decoding processing for the digital signal provided by the A/D section.

9. A sampling filter device comprising:
a first voltage current converter which converts an input voltage signal into a current;
a first integration unit which samples the current output from the first voltage current converter and integrates the sampled current;
a local oscillator which outputs a reference clock; and
an integration time duration control unit which generates an integration time duration control signal for controlling integration time duration in the first integration unit based on the reference clock, and makes the integration time duration variable, thereby performing weighting of a filter characteristic of the sampling filter device in response to the variable integration time duration, wherein the integration time duration control unit has a control signal generator to which the reference clock, an inverse phase signal to the reference clock, an addition signal provided by adding a signal whose phase is 90° different from that of the reference clock to the reference clock, and a signal provided by adding the addition signal to the inverse phase signal to the reference clock are input, and which is controlled by a signal of a double frequency of the reference clock.

10. A sampling filter device comprising:
a first voltage current converter which converts an input voltage signal into a current;
a first integration unit which samples the current output from the first voltage current converter and integrates the sampled current;
a local oscillator which outputs a reference clock; and
an integration time duration control unit which generates an integration time duration control signal for controlling integration time duration in the first integration unit based on the reference clock, and makes the integration time duration variable, thereby performing weighting of a filter characteristic of the sampling filter device in response to the variable integration time duration, wherein the integration time duration control unit has:
a first dividing-type phase shifter which generates a first signal provided by dividing a clock having a double frequency of the reference clock and a second signal whose phase is 90° different from that of the first signal;
a second dividing-type phase shifter which generates a third signal provided by dividing an inverse phase signal to the clock having the double frequency of the reference clock
a first adder which outputs a fifth signal provided by adding the first signal to the second signal;
a second adder which outputs a sixth signal provided by adding the third signal to the second signal; and
a control signal generator for generating the integration time duration control signal based on the first signal, the third signal, the fifth signal, the sixth signal, and the clock having the double frequency of the reference clock.

11. A sampling filter device comprising:
- a first voltage current converter which converts an input voltage signal into a current;
- a first integration unit which samples the current output from the first voltage current converter and integrates the sampled current;
- a local oscillator which outputs a reference clock; and
- an integration time duration control unit which generates an integration time duration control signal for changing integration time duration in the first integration unit based on the reference clock, wherein the first integration unit integrates the sampled current during the integration time duration, thereby performing weighting of a filter characteristic of the sampling filter device in response to the variable integration time duration changed, the sampling filter device further comprising a second voltage current converter arranged in parallel with the first voltage current converter and having a gain different from that of the first voltage current converter, wherein the first integration unit samples the current output from the first voltage current converter or the second voltage current converter, and integrates the sampled current, and integration charge amount per unit time in the first integration unit is varied by switch control of the first voltage current converter and the second voltage current converter.

12. The sampling filter device according to claim 11, wherein the integration time duration control unit generates the integration time duration control signal for changing integration time duration in the first integration unit for each clock of the reference clock, and the first integration unit integrates the sampled current during the correspondingly-changed integration time duration in each clock of the reference clock.

* * * * *

UNITED STATES PATENT AND TRADEMARK OFFICE
CERTIFICATE OF CORRECTION

PATENT NO. : 8,711,917 B2 Page 1 of 1
APPLICATION NO. : 12/812655
DATED : April 29, 2014
INVENTOR(S) : Tsukamoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 599 days.

Signed and Sealed this
Twenty-ninth Day of September, 2015

Michelle K. Lee
*Director of the United States Patent and Trademark Office*